(12) United States Patent
Toshima et al.

(10) Patent No.: US 6,454,508 B2
(45) Date of Patent: *Sep. 24, 2002

(54) DUAL CASSETTE LOAD LOCK

(75) Inventors: Masato M. Toshima, Sunnyvale; Phil M. Salzman, San Jose; Steven C. Murdoch, Palo Alto; Cheng Wang, San Jose; Mark A. Stenholm, San Jose; James Howard, San Jose; Leonard Hall, San Jose, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/070,854

(22) Filed: May 1, 1998

Related U.S. Application Data

(60) Continuation of application No. 08/700,267, filed on Aug. 20, 1996, now Pat. No. 5,769,588, which is a continuation of application No. 08/481,546, filed on Jun. 7, 1995, now abandoned, which is a division of application No. 07/511,481, filed on Apr. 19, 1990, now Pat. No. 5,186,594.

(51) Int. Cl.$^7$ .............................................. B65G 49/05
(52) U.S. Cl. ........................ 414/217; 414/940; 414/939; 118/719
(58) Field of Search ................................. 414/416, 417, 414/222, 217, 935, 936, 937, 938, 800, 939, 940, 217.1; 204/298.25; 118/719, 729, 730, 50, 50.1, 500

(56) References Cited

U.S. PATENT DOCUMENTS

| | | |
|---|---|---|
| 2,224,479 A | 12/1940 | Jones |
| 3,749,383 A | 7/1973 | Voight et al. |
| 4,448,149 A | 5/1984 | Brown, Jr. et al. |
| 4,640,223 A | 2/1987 | Dozier |
| 4,715,921 A | 12/1987 | Maher et al. |
| 4,851,018 A | 7/1989 | Lazzari et al. |
| 4,851,101 A * | 7/1989 | Hutchinson ............. 414/217 X |
| 4,891,488 A | 1/1990 | Davis et al. |
| 4,963,069 A | 10/1990 | Wurst et al. |
| 4,969,790 A | 11/1990 | Petz et al. |
| 4,990,047 A | 2/1991 | Wagner et al. |
| 5,064,337 A * | 11/1991 | Asakawa et al. ....... 414/940 X |
| 5,186,594 A * | 2/1993 | Toshima et al. ............ 414/217 |
| 5,769,588 A * | 6/1998 | Toshima et al. ............ 414/217 |

FOREIGN PATENT DOCUMENTS

| | | |
|---|---|---|
| EP | 0 343 530 | 5/1989 |
| JP | 282224 | 1/1986 |
| JP | 62-139340 | 6/1987 |
| JP | 62-154749 | 7/1987 |
| JP | 62-290616 | 12/1987 |
| JP | 1-166534 | 6/1989 |
| JP | 1-253237 | 10/1989 |
| WO | 8706561 | 1/1987 |

* cited by examiner

*Primary Examiner*—Frank E. Werner
(74) *Attorney, Agent, or Firm*—Dugan & Dugan LLP

(57) ABSTRACT

A workpiece loading interface is included within a workpiece processing system which processes workpieces, typically wafers, in a vacuum. The workpiece loading interface includes two separate chambers. Each chamber may be separately pumped down. Thus, while a first cassette of wafers, from a first chamber is being accessed, a second cassette of wafers may be loaded in the second chamber and the second chamber pumped down. Each chamber is designed to minimize intrusion to a clean room. Thus a door to each chamber has a mechanism which, when opening the door, first moves the door slightly away from an opening in the chamber and then the door is moved down parallel to the chamber. After the door is opened, a cassette of wafers is lowered through the opening in a motion much like a drawbridge. The cassette may be pivoted within the chamber when the position from which wafers are accessed from the cassette differs from the position from which the cassette is lowered out of the chamber.

15 Claims, 3 Drawing Sheets

DUAL CASSETTE LOAD LOCK

This application is a continuation of U.S. patent application Ser. No. 08/700,267, filed Aug. 20, 1996, which is now U.S. Pat. No. 5,769,588 and which is a continuation of U.S. patent application Ser. No. 08/481,546, filed Jun. 7, 1995, which is abandoned and which is a divisional of U.S. patent application Ser. No. 07/511,481, filed Apr. 19, 1990, which is now U.S. Pat. No. 5,186,594.

BACKGROUND

The present invention relates to a front end loading interface used in the loading of workpieces in semiconductor processing equipment.

Semiconductor processing equipment often has a plurality of chambers in which processing occurs. Arm assemblies or other robotic devices are generally used to move workpieces, generally wafers from a wafer queuing station to various chambers for processing. When the processing is finished the wafer is returned to the queuing station. For an example of prior art processing equipment, see U.S. Pat. No. 4,715,921 issued to Maher, et al. for a Quad Processor.

Semiconductor processing is typically done in a vacuum. Therefore, a wafer queuing station into which is placed a cassette of wafers to be processed must be pumped down before the wafers may be accessed. This significantly increases the time the semiconductor processing equipment is idle while waiting for a cassette of processed wafers to be exchanged for a cassette of unprocessed wafers and subsequent pumping down of the wafer queuing station.

Summary of the Invention

In accordance with the preferred embodiment of the present invention, a workpiece loading interface is presented for inclusion within a workpiece processing system. The workpiece loading interface includes two separate chambers. Each chamber may be separately pumped down. Thus, while a first cassette of workpieces, typically wafers, from a first chamber are being accessed, a second cassette of wafers may be loaded in the second chamber and the second chamber may then be pumped down. This can significantly increase throughput of wafers through the workpiece processing system.

In the preferred embodiment, each chamber is designed to minimize intrusion to a clean room. Thus a door to each chamber has a mechanism which, when opening the door, first moves the door slightly away from an opening in the chamber and then the door is moved down parallel to the chamber. After the door is opened, a cassette of wafers is lowered through the opening in a motion much like a drawbridge. The cassette of wafers is on a support with no side panels, facilitating the replacement of a cassette of processed wafers with a cassette of unprocessed wafers by an automated device. The cassette may be pivoted within the chamber when the position from which wafers are accessed from the cassette differs from the position from which the cassette is lowered out of the chamber.

GRIEF DESCRIPTION OF THE DRAWINGS

DESCRIPTION OF THE PREFERRED EMBODIMENT

Figure 1:
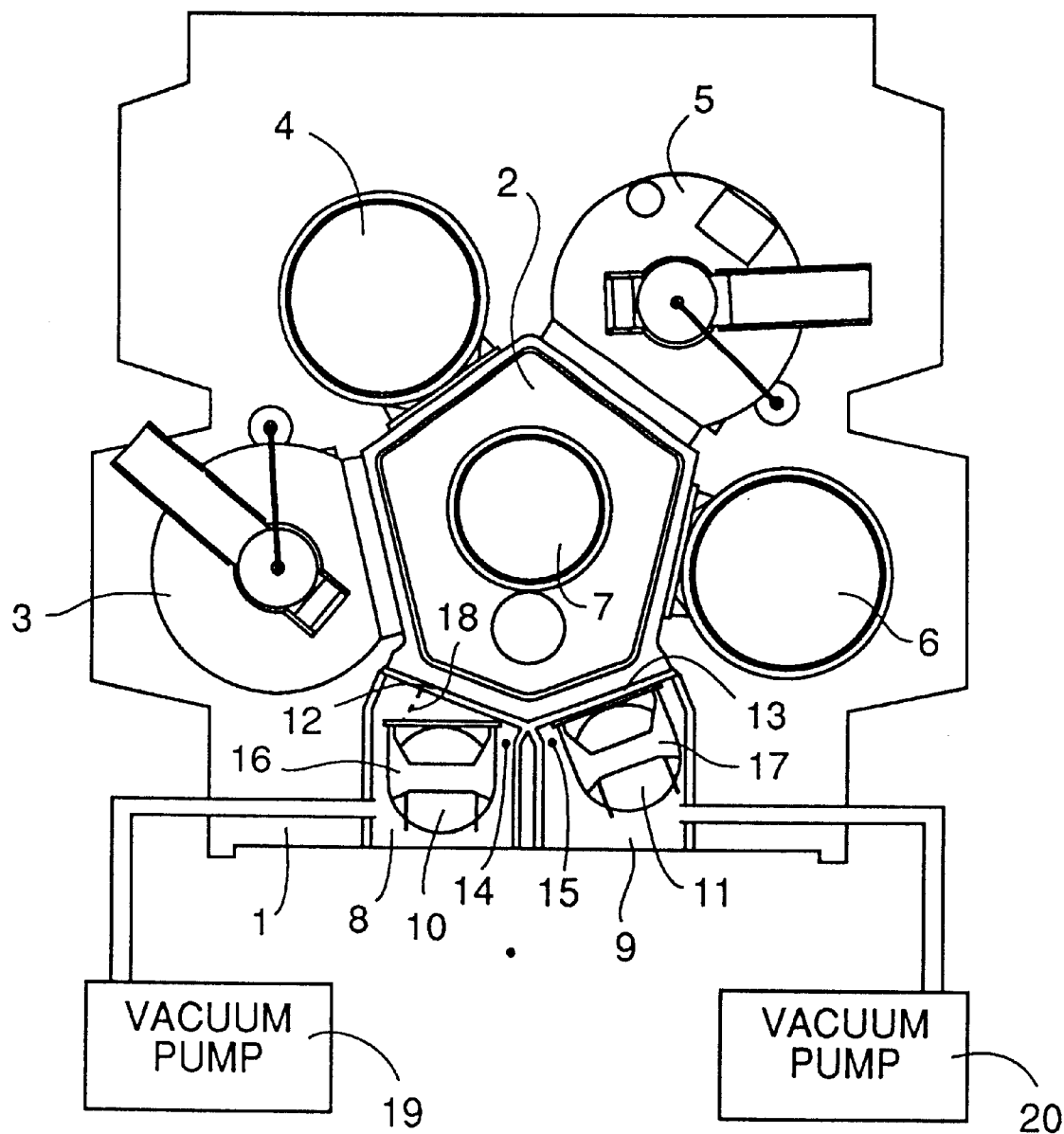
FIG. 1 shows a top view of a block diagram of semiconductor processing equipment which includes two cassette load locks in accordance with the preferred embodiment of the present invention.

In FIG. 1, a top view of semiconductor processing equipment 1 is shown. Semiconductor processing equipment 1 may be used, for example, for etching wafers.

Semiconductor processing equipment 1, includes, for example, a processing chamber 3, a processing chamber 4, a processing chamber 5 and a processing chamber 6. A central chamber 2 may be used to temporarily store wafers on robotic equipment 7 when wafers are being moved to or from various of the processing chambers.

Semiconductor processing equipment 1 also includes dual cassette load locks. In chamber 8, a wafer cassette 16 holds wafers 10. In chamber 9, a wafer cassette 17 holds wafers 11. Wafer tray 17 pivots around a pivot point 15. When wafers 11 from tray 17 are accessed by semiconductor processing equipment 1 for processing, wafer tray 17 is flush against a gate 13, as shown, and easily accessed by robotic equipment 7 for transportation into central chamber 2. When wafer tray 17 is ready to be removed from chamber 9, wafer tray 17 is pivoted back from gate 13 in preparation for the opening of chamber 9 and removal of wafer tray 17.

Similarly, wafer tray 16 pivots around a pivot point 14. When wafers 10 from tray 16 are accessed by semiconductor processing equipment 1 for processing, wafer tray 16 is flush against a gate 12 and easily accessed by robotic equipment 7 for transportation into central chamber 2. When wafer tray 16 is ready to be removed from chamber 8, wafer tray 16 may be pivoted back an angle 18 from gate 12, as shown, in preparation for the opening of chamber 8 and removal of wafer tray 16. In the preferred embodiment, angle 18 is about twenty-one degrees.

Chamber 8 and chamber 9 may be separately and individually pumped down. A vacuum pump 19 is able to provide a vacuum in chamber 8. A vacuum pump 20 is able to provide a vacuum in chamber 9. In FIG. 1, vacuum pumps 19 and 20 are shown in schematic form. Typically pumps 19 and 20 would reside within semiconductor processing equipment 1. Further, while FIG. 1 shows two separate pumps, a single pump could be used to separately and individually pump down chamber 8 and chamber 9.

Figure 2:
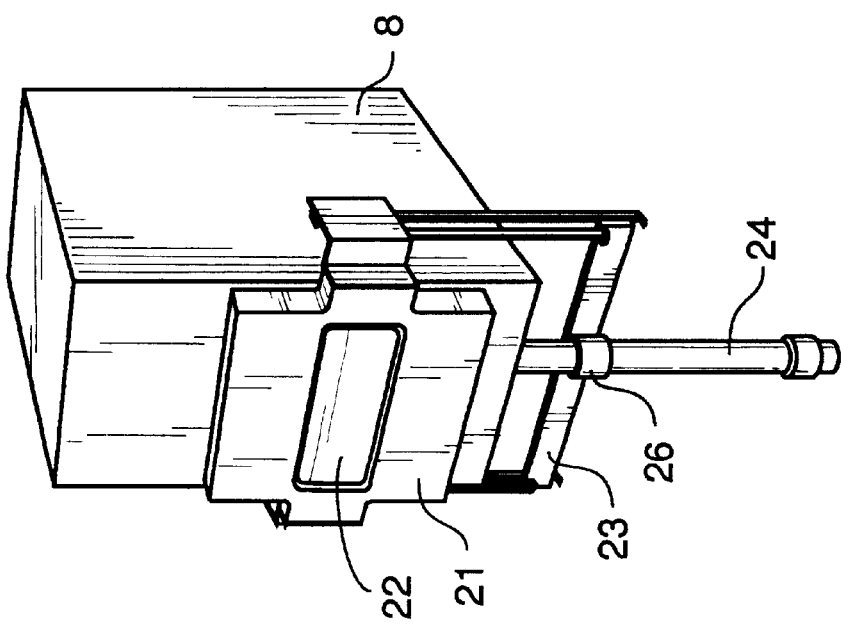
FIG. 2 shows a block diagram of a load lock which is part of the semiconductor processing equipment shown in FIG. 1 in accordance with the preferred embodiment of the present invention.

FIG. 2 shows a simplified block diagram front view of wafer chamber 8. In the preferred embodiment, the volume of chamber 8 is 46 liters. A door 21 is shown in a closed position. Door 21 includes an observation window 22. Door 21 is opened and closed using a pneumatic actuator within a rod 24. Magnets in the pneumatic actuator interface attract an outer ring 26. Outer ring 26 is connected to door 21 through an assembly 23.

Figure 3:
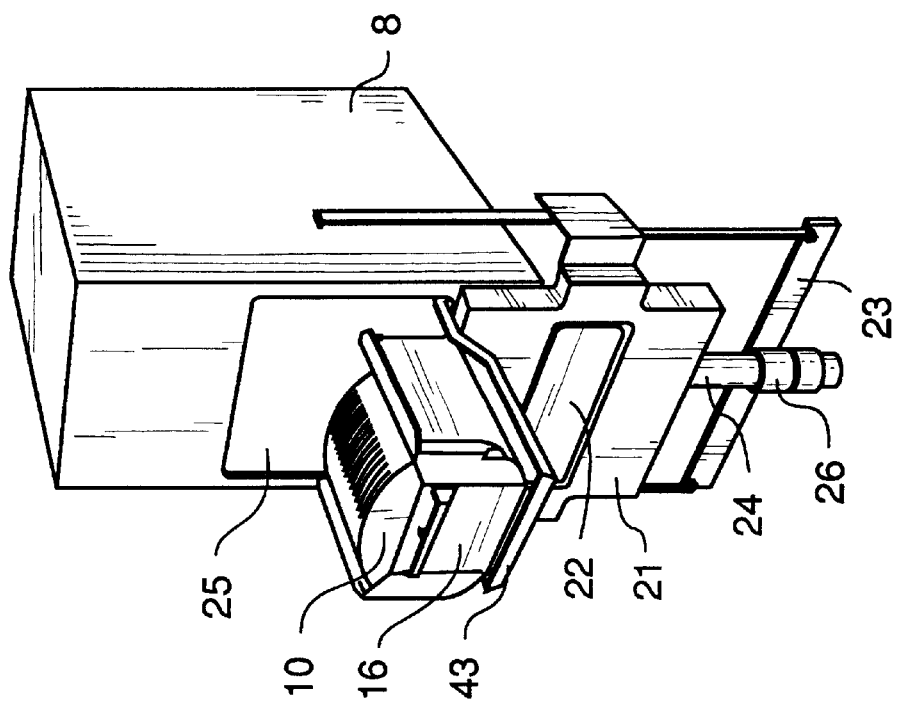
FIG. 3 shows a second block diagram of the load lock shown in FIG. 2 in accordance with the preferred embodiment of the present invention.

FIG. 3 shows door 21 lowered into an open position. An opening 25, for example, may be fifteen inches high and ten and one half inches wide. By opening down, the intrusion of door 21 into a clean room may be minimized. In the preferred embodiment the total intrusion is about one inch.

Once door 21 is lowered, wafer tray 16, on a support structure 43, may then be lowered out of chamber 8, much like a draw bridge is lowered at a castle entrance. Wafer tray 16 may then be removed and a new wafer tray placed upon support structure 43. Support structure 43 is designed with a hollow bottom so that when door 21 is opened and wafer tray 16 is lowered, a laminar airflow may sweep downward through wafers 10.

Figure 4:
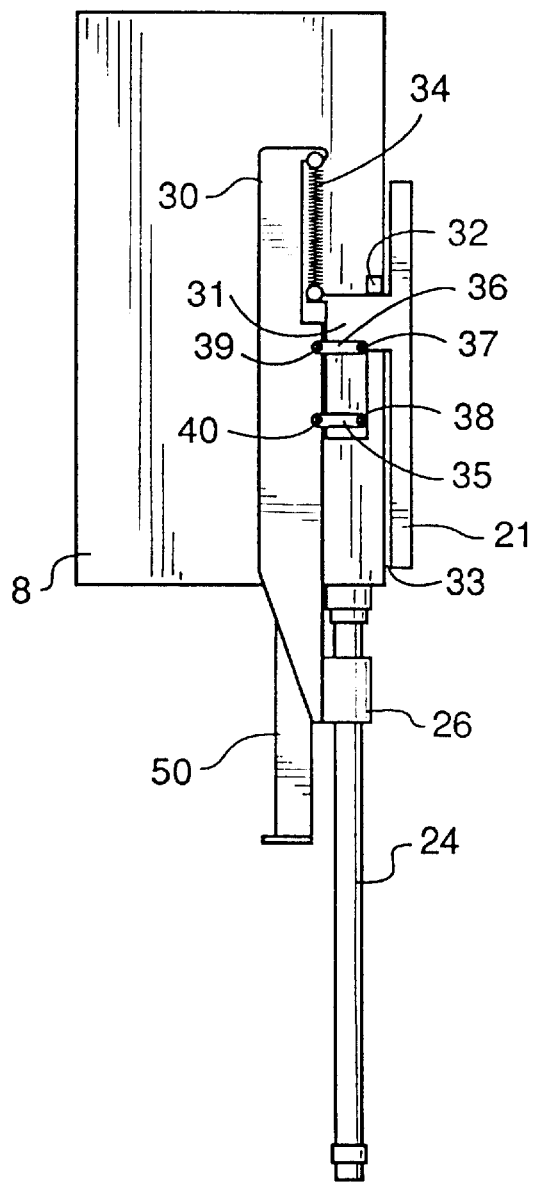
FIG. 4 shows another block diagram of the load lock shown in FIG. 2 in accordance with the preferred embodiment of the present invention.

In FIG. 4, additional detail of the mechanism which controls the opening and shutting of door 21 is shown. A side panel 31 of door 21 is connected to a carriage 30 by a spring 34, a link 36 and a link 35. As controlled by the pneumatic actuator within rod 24, door 21 travels up and down parallel to a rail 50. When being closed, door 21 is stopped by an abutment 32; however, carriage 30 continues upward, expanding spring 34, until a gap 33 is completely closed. While carriage 30 continues moving upward, a pivot 39 connected to link 36, and a pivot 40 connected to link 35 continue moving upward. However, a pivot 37 connected to link 36 and a pivot 38 connected to link 35 cause door 21 to move towards carriage 30. Therefore, as gap 33 is closed, links 35 and 36 translate the upward motion of carriage 30 into horizontal motion of door 21. Door 21 is thus brought snug against, and hence seals chamber 8.

When door 21 is opened, spring 34 compresses causing gap 33 to reappear and links 35 and 36 to straighten, thus moving door 21 horizontally away from chamber 8.

Figure 6:
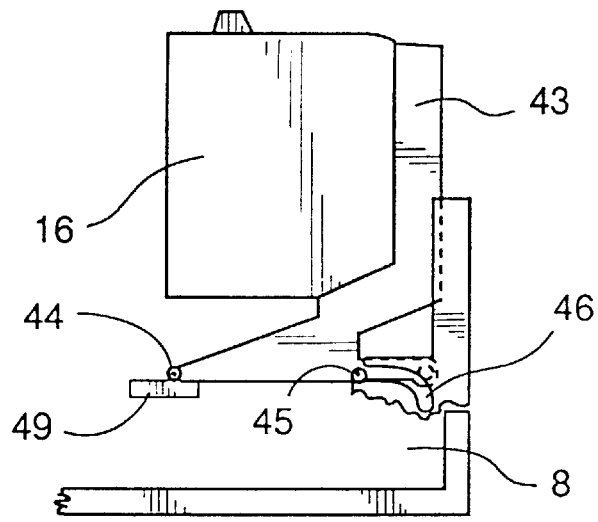
FIG. 6 is a block diagram of the cassette wafer shown in FIG. 5 in an upright position within the load lock shown in FIG. 2 in accordance with the preferred embodiment of the present invention.
Figure 5:
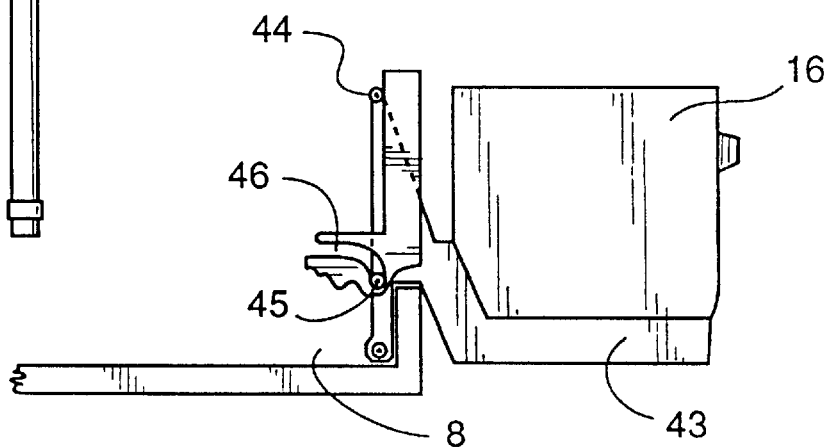
FIG. 5 is a block diagram of a cassette wafer holder in a position extended out of the load lock shown in FIG. 2 in accordance with the preferred embodiment of the present invention.

FIGS. 5 and 6 show a block diagram of one possible implementation of an assembly for guiding the lowering and raising of support structure 43. In FIG. 5, support structure 43 and cassette 16 are shown lowered out of chamber 8. A roller 44 connected to support structure 43 is shown resting on an extension of a cam containing slot 46 within chamber 8. A roller 45, also connected to support structure 43, is shown at a first end of a slot track 46.

In FIG. 6, support structure 43 and cassette 16 are shown in the upright position within chamber 8. In this position, wafers 10 are horizontal and are stacked so that they are ready to be accessed by semiconductor processing equipment 1. When support structure 43 and cassette 16 are in the upright position, roller 45 is rolled to a second end of slot track 46 and roller 44 rests against a stop 49. Stop 49 is an extension of the cam which contains slot 46.

What is claimed is:

1. A work piece processing system comprising:
   a central transfer chamber;
   a work piece handler contained in the central transfer chamber;
   at least one vacuum processing chamber coupled to the central transfer chamber;
   a vacuum pump coupled to the vacuum processing chamber;
   at least one external chamber coupled to the central transfer chamber having a first wall having a first opening adapted to receive a work piece carrier and a second wall having a second opening, the second wall being non-parallel to the first wall; and
   a pivot mechanism located within the external chamber adapted to pivot a work piece carrier horizontally between a first position in which the work piece carrier may be accessed via the first opening, and a second position from which the work piece carrier may be accessed, via the second opening by the work piece handler contained in the central transfer chamber of the work piece processing system;
   wherein the pivot mechanism is adapted to pivot a work piece carrier about a pivot point that does not coincide with a central axis of the work piece carrier.

2. The apparatus of claim 1, further comprising:
   a door which, when shut, covers and seals the first opening; and a door mechanism adapted to, when opening the door, first move the door slightly away from the first opening and then move the door down parallel to the external chamber, wherein the moving door does not experience surface friction as the door moves parallel to the external chamber.

3. The apparatus of claim 1, wherein the pivot mechanism pivots between the first and second positions about a substantially vertical axis.

4. The apparatus of claim 1 wherein the pivot mechanism further pivots in a drawbridge manner from the first position, through the first opening to a third position.

5. The apparatus of claim 4, wherein when the pivot mechanism pivots between the first and second positions, a work piece carrier positioned thereon pivots approximately twenty-one degrees, and when the pivot mechanism pivots between the first and third positions a work piece carrier positioned thereon pivots approximately ninety degrees.

6. A work piece processing system comprising:
   a central transfer chamber;
   at least one vacuum processing chamber coupled to the central transfer chamber;
   at least one external chamber, having an opening adapted to allow a work piece carrier to be received therethrough, coupled to the central transfer chamber;
   a work piece carrier support mechanism located within the external chamber and adapted to lower a work piece carrier vertically out of the external chamber through the opening in a drawbridge motion; and
   a pivot mechanism located within the external chamber adapted to pivot a work piece carrier horizontally between a first position in which the work piece carrier may be accessed via the opening, and a second position in which the work piece carrier may be accessed via a work piece handler contained in the central transfer chamber of the work piece processing system.

7. The work piece processing system of claim 6, wherein the work piece carrier support mechanism is adapted to receive the work piece carrier in a first orientation wherein the work pieces contained therein are vertically arranged, outside the external chamber and to rotate the work piece carrier to a second orientation wherein the work pieces contained therein are horizontally arranged, as the work piece carrier moves through the opening.

8. The work piece processing system of claim 7, wherein the work piece carrier support has an opening which is below the work piece carrier when the work piece carrier is in the first orientation outside the chamber, so as to facilitate laminar airflow therethrough.

9. The work piece processing system of claim 8, wherein the work piece carrier support is adapted to support a work piece carrier containing a plurality of work pieces.

10. The apparatus of claim 6, further comprising:
    a door which, when shut, covers and seals the opening; and
    a door mechanism adapted to, when opening the door, first move the door slightly away from the opening and then move the door down parallel to the chamber, wherein the moving door does not experience surface friction as the door moves parallel to the chamber.

11. An apparatus to be used in a work piece processing system, comprising:

an external chamber adapted to couple to a central chamber of the work piece processing system, the external chamber having an opening adapted to allow a work piece carrier to be received therethrough;

a work piece carrier support mechanism adapted to lower a work piece carrier out of the external chamber through the opening in a drawbridge motion; and a pivot mechanism located within the external chamber adapted to pivot a work piece carrier horizontally between a first position in which the work piece carrier may be accessed via the opening, and a second position in which the work piece carrier may be accessed, via a work piece handler contained in the central chamber of the work piece processing system;

wherein the pivot mechanism is adapted to pivot a work piece carrier about a pivot point that does not coincide with a central axis of the work piece carrier.

12. The apparatus of claim 11, wherein the work piece carrier support mechanism is adapted to receive a work piece carrier in a vertical orientation outside the chamber and to rotate the work piece carrier to a horizontal orientation as the work piece carrier moves through the opening.

13. The apparatus of claim 12, wherein the work piece carrier support has an opening which is below the work piece carrier when the work piece carrier is in the vertical orientation outside the chamber, so as to facilitate laminar airflow therethrough.

14. The apparatus of claim 13, wherein the work piece carrier support is adapted to support a work piece carrier containing a plurality of work pieces.

15. The apparatus of claim 11, further comprising:

a door which, when shut, covers and seals the opening; and a door mechanism adapted to, when opening the door, first move the door slightly away from the opening and then move the door down parallel to the chamber, wherein the moving door does not experience surface friction as the door moves parallel to the chamber.

* * * * *